Figure 1:
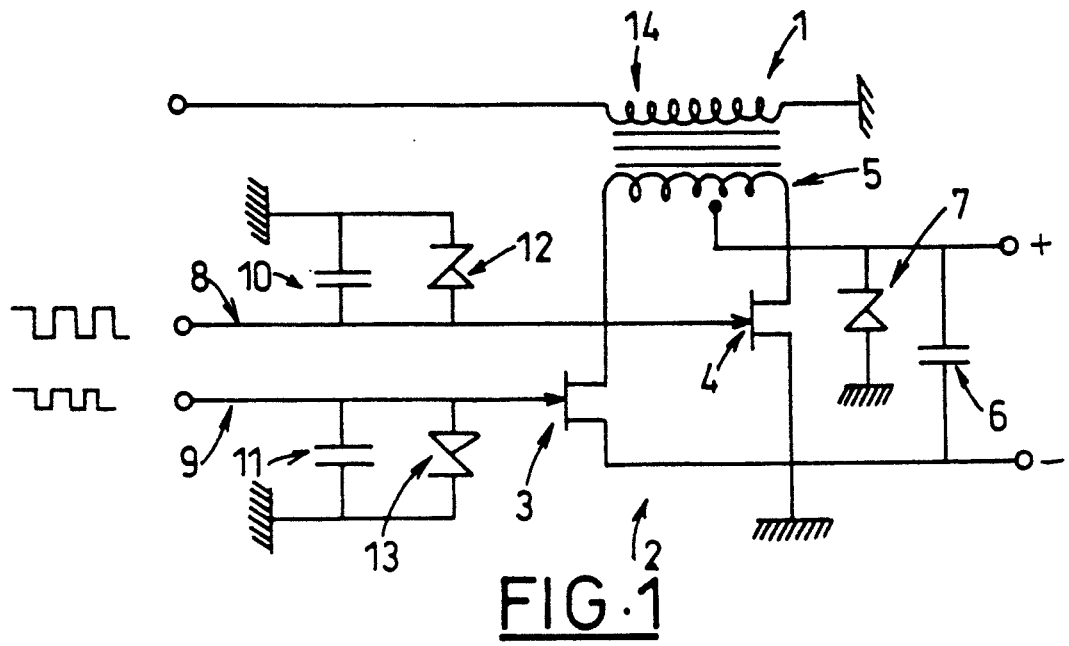

United States Patent [19]
Chaussy et al.

[11] Patent Number: 5,329,440
[45] Date of Patent: Jul. 12, 1994

[54] DEVICE FOR CONVERTING A VERY-LOW-AMPLITUDE STEADY VOLTAGE SIGNAL INTO AN ALTERNATING VOLTAGE SIGNAL

[75] Inventors: Jacques Chaussy, Echirolles; Jean-Louis Bret, Seyssins; Bernard Picot, Brie et Angonnes; Jacques Meyer, Sartrouville, all of France

[73] Assignees: Framatome, Courbevoie; Centre National de la Recherche Scientifique (CNRS), Paris, both of France

[21] Appl. No.: 1,643

[22] Filed: Jan. 7, 1993

[30] Foreign Application Priority Data

Jan. 7, 1992 [FR] France .................. 92 00083

[51] Int. Cl.$^5$ .................................. H02M 7/538
[52] U.S. Cl. ...................... 363/146; 363/134; 363/141; 505/867
[58] Field of Search ............... 363/14, 141, 146, 134; 324/120; 505/846, 867

[56] References Cited

U.S. PATENT DOCUMENTS 3,761,742  9/1973  Titus et al. ................ 363/134
4,074,343  2/1978  Chaussy et al. .............. 363/14

FOREIGN PATENT DOCUMENTS 2329077  5/1977  France ................ H01L 39/18

OTHER PUBLICATIONS

McGrath et al, "Accurate Noise Measurements of Cryogenic Microwave Amplifiers and Mixers Using Variable-Temperature Loads," 15th Eur. Microwave Conf. Proc., pp. 477–482, Sep. 1985 (Paris).
Howard, "Optimization of Indium-Lead Alloys ...," IBM Journal of R+D, vol. 26, No. 3, pp. 372–378, May 1982.
Tien et al, "Glass Microsphere Cryogenic Insulation," Cryogenics, vol. 16, No. 10, pp. 583–586, Oct., 1976.

Primary Examiner—William H. Beha, Jr.
Attorney, Agent, or Firm—Pollock, Vande Sande & Priddy

[57] ABSTRACT

This device for converting a very-low-amplitude steady voltage signal into an alternating voltage signal, of the type comprising a centre-tapped transformer (1) associated with a transistor (3,4) chopper (2), is characterised in that the transformer (1) and the transistors (3,4) are arranged in a housing (15) held at very low temperature and in which is arranged a material (20) for thermal insulation of the transistors (3,4) with respect to the rest of the housing so as to reduce temperature fluctuations and allow operation of these transistors by self-heating due to their drive current.

8 Claims, 1 Drawing Sheet

DEVICE FOR CONVERTING A VERY-LOW-AMPLITUDE STEADY VOLTAGE SIGNAL INTO AN ALTERNATING VOLTAGE SIGNAL

The present invention relates to a device for converting a very-low-amplitude steady voltage signal into an alternating voltage signal.

More particularly, this device is used, for example, in devices for measuring voltages of the order of $10^{-10}$ volts.

In order to amplify such steady or slowly-varying voltages, recourse is frequently had to devices known by the name of choppers the function of which is to cut up the said steady or slowly-varying voltage into a succession of constant-width pulses whose height is representative of the amplitude of the steady or slowly-varying voltage.

Amplification of the resultant pulse signal is then similar to amplification of an alternating signal, amplification of this type of signal being generally easier to carry out than that of a steady or slowly-varying signal.

The first chopper devices which were produced, used electromechanical components, generally called vibrators, and constituted by contacts which were opened or closed by the action of an electromagnet supplied with sinusoidal or rectangular alternating current.

Next, recourse was had to electronic switching means, valves, conventional transistors, field-effect transistors (FET), combined or otherwise with optical control means, photodiodes, phototransistors, photoresistors, and possibly to these photosensitive devices alone (see, for example, the document FR-A-2,329,077).

These technological advances made it possible to progressively reduce the noise which is characteristic of switching devices themselves, as well as the parasitic signal induced by the control signal (optical coupling), thus allowing the measurement of very-low-amplitude signals, of the order of a microvolt, or even of a fraction of a microvolt.

However, in order to achieve still greater sensitivities, it is imperative to make the switching devices work at low and even at very low temperatures, in such a way as to significantly reduce noise of whatever origin (electronic, thermo-electronic, thermal).

By using liquid nitrogen, whose boiling temperature is 77° K., as refrigeration source for this assembly, it has been possible to descend to a nanovolt and even slightly below.

However, the ideal would be to be able to get to temperatures close to absolute zero, for example to 4.2° K., the boiling temperature of liquid helium. At this temperature level, the various noises mentioned above become practically negligible, however, a problem then arises which is difficult to resolve.

In effect, the best transistors, for example the best field-effect transistors, which are selected to operate at 77° K., do not operate at all at this temperature as the charge carriers (electrons and holes) have lost all mobility.

The aim of the invention is thus to resolve these problems by proposing a conversion device which is simple, reliable and which can operate at such temperatures.

To this end, the subject of the invention is a device for converting a very-low-amplitude steady voltage signal into an alternating voltage signal, of the type comprising a centre-tapped transformer associated with a transistor chopper, characterised in that the transformer and the transistors are arranged in a housing held at very low temperature and in which is arranged a material for thermal insulation of the transistors with respect to the rest of the housing so as to reduce temperature fluctuations and allow operation of these transistors by self-heating due to their drive current.

Figure 2:
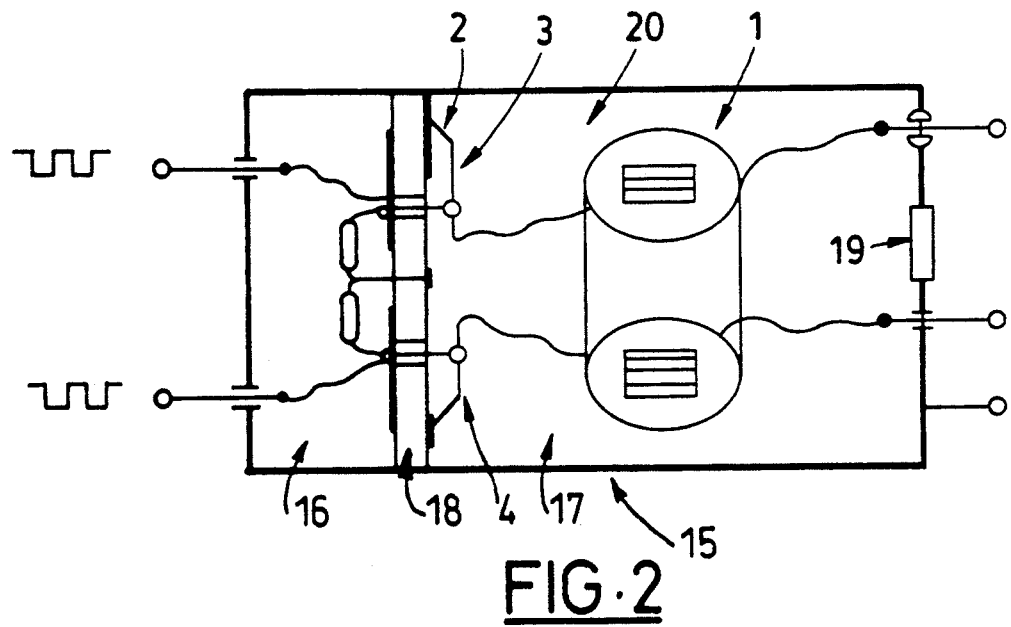

The invention will be better understood with the aid of the description which will follow, given solely by way of example and by referring to the attached drawings, in which:

FIG. 1 represents a circuit diagram of a conversion device according to the invention; and FIG. 2 represents a sectional view of a housing in which a conversion device according to the invention is arranged.

As can be seen in FIG. 1, which represents a circuit diagram of a conversion device according to the invention, the device is based on the use of a centre-tapped transformer designated by the general reference 1 and by a transistor chopper 2, designated by the references 3 and 4.

The positive terminal of the input of the steady voltage signal which is to be converted is linked to the mid-point of the corresponding winding, for example 5, of the transformer, while each end of the latter is linked to a corresponding transistor 3,4.

These transistors are, for example, field-effect transistors.

A decoupling capacitor 6 is connected between the positive and negative terminals of the steady voltage signal input and a zener diode 7 for protection against overvoltages is also connected to this positive terminal.

The gates of the field-effect transistors 3 and 4 receive control signals via lines 8 and 9, the latter being decoupled by capacitors 10 and 11 respectively and protected by zener diodes 12 and 13 respectively.

An alternating voltage signal is obtained at the terminals of the other winding 14 of the transformer by driving one or other of the transistors, in a conventional way.

As has been indicated above, this alternating voltage is easier to measure than a steady voltage.

As can be seen in FIG. 2, the transformer 1 and the chopper 2 are arranged in a housing 15 divided into two parts 16 and 17 by a separating partition 18.

The transformer 1 and the transistors 3 and 4 of the chopper are arranged in the part 17 of the latter, while the rest of the circuit is arranged in the part 16 of the latter.

This housing may be made of an electrically conducting or superconducting material constituting, in the latter case, a near-perfect Faraday cage.

The transistors 3 and 4 may be constituted, for example, by field-effect transistors of the NE 72089 type marketed by the NEC company. These field-effect transistors are gallium arsenide transistors.

These transistors exhibit a certain number of advantages with respect to silicon transistors, among which are a very low input parasitic capacitance, a very low gate leakage current and the possibility of operating at lower temperatures.

With respect to the transformer 1 itself, it is a voltage step-up or matching transformer of the toric type with a core made of magnetic material, chosen from among those which exhibit good permeability over a wide temperature range and which have very low microphony (metallic Amorphe or Cryoperm, for example).

Hence it will be noted that the conversion device according to the invention uses standard components which are less expensive and easier to implement than more recent technological elements, such as SQUIDs (Superconducting Quantum Interference Device) or JOSEPHSON-effect junctions.

The chopper-transformer assembly is arranged in a part of the housing 15 which is held at very low temperature, for example less than or equal to 4.2° K. by using, for example, liquid helium, introduced into the housing through a Poral disc 19. A material for thermal insulation of the transistors 3 and 4 is also arranged in this part of the housing so as to reduce temperature fluctuations and allow operation of these transistors by self-heating due to their drive current.

In effect, it was indicated above that the transistors do not operate normally at such low temperatures. By providing this thermal insulation material, the energy dissipated in each transistor by its power supply current is used to bring its temperature to a value which is sufficient to allow it to operate normally even though it is in a very-low-temperature environment.

In the case of a field-effect transistor, the energy released by the bias current of such a transistor, although slight, is sufficient to bring its temperature to about 120° K. if the thermal transfers between heat source (FET) and cold source (liquid helium) are well controlled by the insulation material.

This insulation material, designated by the general reference 20 in FIG. 2, may comprise glass microspheres with a diameter of the order of 20 μm. These spheres also make it possible to reduce microphony and temperature disparities and to hold the transformer and its connecting wires in position.

Moreover, special precautions are also taken to eliminate thermoelectric noise generated at the site of soldered joints providing the continuity for the electrical links between the various components of the circuit.

The tin/lead alloys usually used in fact exhibit two defects, namely great fragility to thermal shocks and thermoelectric noise which is incompatible with the level of resolution sought.

In order to produce these soldered joints an indium/-lead alloy has been used in proportions close to 50% for each component, this alloy exhibiting excellent response to thermal shocks and practically zero noise voltage.

At a frequency of 55 Hz and at temperatures of 4° K. and of 290° K., the non-compensated noise, offset voltage and offset current, reflected to the input of the device, are as follows:

| Nature of the signal | at 4° K. | at 290° K. |
|---|---|---|
| noise | 0.1 nV/(Hz)$^{\frac{1}{2}}$ | 0.8 nV/(Hz)$^{\frac{1}{2}}$ |
| offset voltage | 3 nV | 8 nV |
| offset current | 300 pA | 2 nA |

The offset current due in essence to the input capacitance of the field-effect transistors is substantially proportional to the operating frequency. Since this current is constant, it is easy to compensate for it via an appropriate circuit. The same applies to the offset voltage.

Thus it is envisaged that the chopper according to the invention uses gallium arsenide transistors and an amorphous material for the magnetic circuit of the transformer, and that the housing is filled with insulating material exhibiting the form of microspheres, for example. It should be noted that an insulating powder may also be used.

This set of characteristics confers a certain number of advantages on the conversion device according to the invention, amongst which are low offset signals at input, low microphony, low noise and operation over an extended temperature range from 1° to 300° K.

The latter property is particularly advantageous, since it allows this device, of simple construction and of relatively low cost, to provide:

at ambient temperature, a service advantageously comparable to that of the best conventional laboratory microvoltmeters whose resolution does not descend below $10^{-8}$ volts. Even at this temperature, the noise sources of this novel type of chopper, which are essentially linked to the thermoelectric effect of the linking wires and to the noise current of the field-effect transistors, limit its resolving power to $10^{-9}$ volts.

at very low temperature, a service comparable to that of the SQUID devices mentioned above, whose sensitivity is of the order of $10^{-12}$ volts, but whose cost is much higher and which are much more temperamental in operation.

Needless to say other temperatures of the housing may be used such as, for example, a temperature less than or equal to 77° K. in the event that the refrigeration source is a liquid nitrogen source.

We claim:

1. Device for converting of a very-low-amplitude steady voltage signal into an alternating voltage signal, of the type comprising a centre-tapped transformer (1) associated with a transistor (3,4) chopper (2), characterised in that the transformer (1) and the transistors (3,4) are arranged in a housing (15) held at very low temperature and in which is arranged a material (20) for thermal insulation of the transistors (3,4) with respect to the rest of the housing so as to reduce temperature fluctuations and allow operation of these transistors by self-heating due to their drive current.

2. Device according to claim 1, characterised in that the temperature of the housing is less than or equal to 77° K.

3. Device according to claim 2, characterised in that the temperature of the housing is less than or equal to 4.2° K.

4. Device according to any one of the preceding claims, characterised in that the transistors (3,4) are field-effect transistors.

5. Device according to any one of claims 1 to 3, characterised in that the transistors (3,4) are gallium arsenide transistors.

6. Device according to any one of claims 1 to 3, characterised in that the soldered joints for linking the components of the device are produced using an indium/lead alloy.

7. Device according to any one of claims 1 to 3, characterised in that the housing is made of an electrically superconducting material.

8. Device according to any one of claims 1 to 3, characterised in that the insulation material is formed of glass microspheres.

* * * * *